(12) United States Patent
Fattal et al.

(10) Patent No.: US 7,964,925 B2
(45) Date of Patent: Jun. 21, 2011

(54) PHOTODIODE MODULE AND APPARATUS INCLUDING MULTIPLE PHOTODIODE MODULES

(75) Inventors: David Fattal, Mountain View, CA (US); Jason Blackstock, Palo Alto, CA (US); Duncan Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 936 days.

(21) Appl. No.: 11/654,046

(22) Filed: Jan. 17, 2007

(65) Prior Publication Data
US 2008/0099793 A1 May 1, 2008

Related U.S. Application Data

(63) Continuation-in-part of application No. 11/580,647, filed on Oct. 13, 2006.

(51) Int. Cl.
*H01L 31/06* (2006.01)
*H01L 27/14* (2006.01)
(52) U.S. Cl. ............... 257/431; 257/461; 257/E31.115; 257/E27.133; 136/256
(58) Field of Classification Search ............... 257/431, 257/461, E31.115, E27.133; 136/244, 256
See application file for complete search history.

(56) References Cited

U.S. PATENT DOCUMENTS

| | | | | |
|---|---|---|---|---|
| 3,475,609 A * | 10/1969 | Schneider | ..................... | 359/245 |
| 3,622,844 A * | 11/1971 | Barelli et al. | ................. | 257/438 |
| 4,011,016 A * | 3/1977 | Layne et al. | ................. | 356/402 |
| 4,727,254 A * | 2/1988 | Wlodarczyk | ............ | 250/227.18 |
| 4,975,919 A * | 12/1990 | Amada et al. | ................... | 372/33 |
| 5,985,689 A * | 11/1999 | Gofuku et al. | .................. | 438/59 |
| 6,040,936 A * | 3/2000 | Kim et al. | ..................... | 359/245 |
| 6,594,422 B2 * | 7/2003 | Taylor et al. | .................... | 385/37 |
| 6,649,990 B2 * | 11/2003 | Morse | ........................... | 257/431 |
| 6,738,551 B2 * | 5/2004 | Noda et al. | .................... | 385/130 |
| 6,968,096 B2 * | 11/2005 | Kittaka et al. | ................. | 385/10 |
| 6,992,774 B2 * | 1/2006 | Creasey et al. | ............... | 356/450 |
| 7,013,072 B2 * | 3/2006 | Kinoshita | ..................... | 385/131 |
| 7,122,446 B2 * | 10/2006 | Nitta et al. | .................... | 438/458 |
| 7,170,600 B2 * | 1/2007 | Nishii et al. | .................. | 356/328 |
| 7,197,203 B2 * | 3/2007 | Koyama | ......................... | 385/14 |
| 7,208,811 B2 * | 4/2007 | Tamai | ........................... | 257/461 |
| 7,223,960 B2 * | 5/2007 | Mouli | ........................... | 250/226 |
| 7,245,808 B2 * | 7/2007 | Sato et al. | ..................... | 385/129 |
| 7,411,232 B2 * | 8/2008 | Ueda et al. | .................... | 257/291 |
| 7,417,219 B2 * | 8/2008 | Catrysse et al. | .............. | 250/234 |
| 7,508,046 B2 * | 3/2009 | Nagai et al. | ................... | 257/459 |
| 7,544,922 B2 * | 6/2009 | Ueyanagi et al. | ............. | 250/216 |
| 7,586,167 B2 * | 9/2009 | Gorrell et al. | ................. | 257/431 |
| 2003/0183892 A1* | 10/2003 | Morse | ........................... | 257/431 |
| 2004/0136673 A1* | 7/2004 | Kinoshita | ..................... | 385/129 |
| 2006/0192115 A1* | 8/2006 | Thomas et al. | ............... | 250/306 |
| 2006/0291780 A1* | 12/2006 | Sato et al. | ........................ | 385/39 |
| 2007/0096087 A1* | 5/2007 | Catrysse et al. | ................ | 257/40 |

(Continued)

*Primary Examiner* — Mary Wilczewski

(57) ABSTRACT

Various embodiments of the present invention are directed to a photodiode module including a structure configured to selectively couple light to a dielectric-surface mode of a photonic crystal of the photodiode module. In one embodiment of the present invention, a photodiode module includes a semiconductor structure having a p-region and an n-region. The photodiode module further includes a photonic crystal having a surface positioned adjacent to the semiconductor structure. A diffraction grating of the photodiode module may be positioned and configured to selectively couple light incident on the diffraction grating to a dielectric-surface mode associated with the surface of the photonic crystal. In another embodiment of the present invention, a photodiode apparatus includes multiple, stacked photodiode modules, each of which is configured to selectively absorb light at a selected wavelength or range of wavelengths.

14 Claims, 7 Drawing Sheets

U.S. PATENT DOCUMENTS

| | | |
|---|---|---|
| 2007/0116420 A1* | 5/2007 | Estes et al. .................... 385/130 |
| 2007/0194357 A1* | 8/2007 | Oohashi et al. ............... 257/292 |
| 2008/0090318 A1* | 4/2008 | Fattal et al. .................... 438/48 |
| 2008/0099793 A1* | 5/2008 | Fattal et al. .................... 257/233 |
| 2008/0212102 A1* | 9/2008 | Nuzzo et al. .................. 356/445 |
| 2008/0266640 A1* | 10/2008 | Wang et al. .................... 359/244 |
| 2008/0278728 A1* | 11/2008 | Tetz et al. ...................... 356/445 |
| 2008/0290434 A1* | 11/2008 | Chen et al. ..................... 257/431 |
| 2009/0079976 A1* | 3/2009 | Cunningham et al. ........ 356/246 |

* cited by examiner

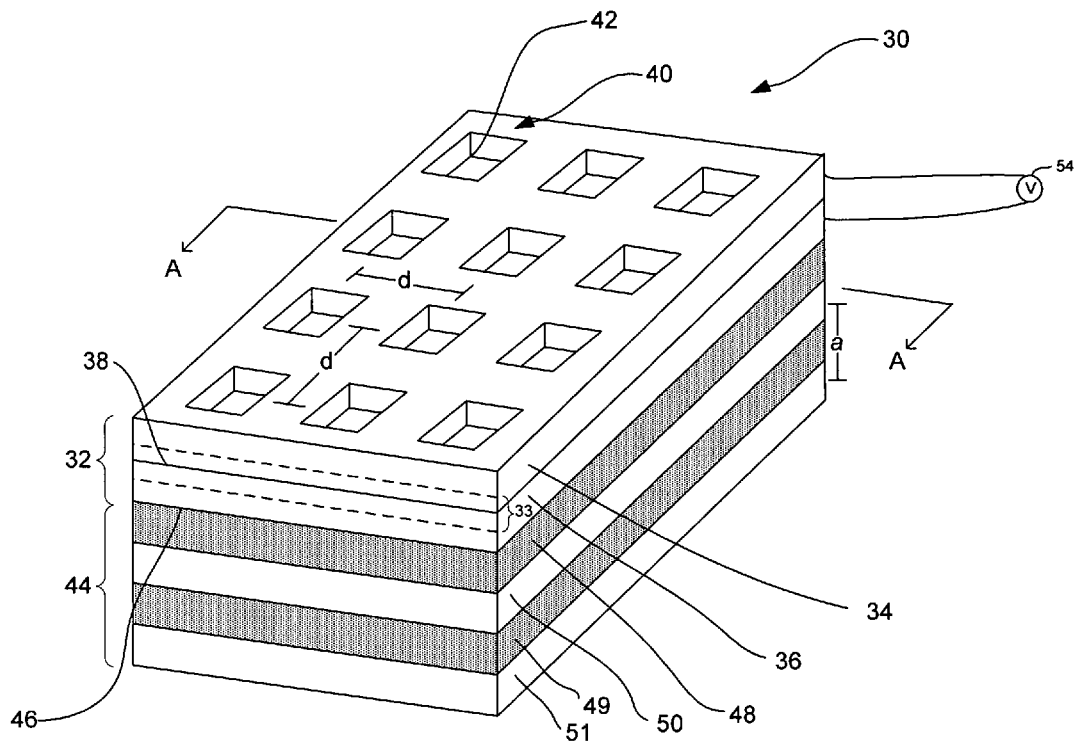
*Figure 3*
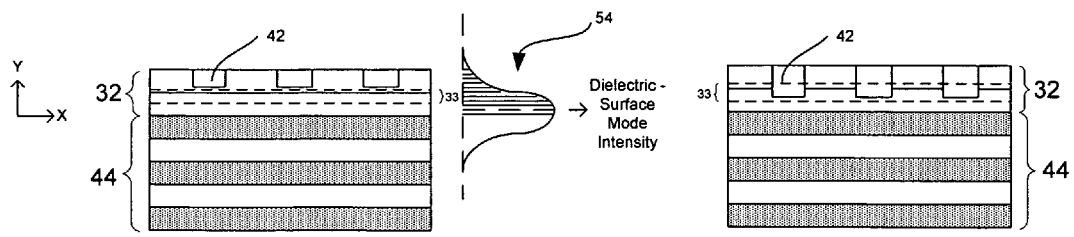
*Figure 4A*  *Figure 4B*

PHOTODIODE MODULE AND APPARATUS INCLUDING MULTIPLE PHOTODIODE MODULES

CROSS-REFERENCE TO RELATED APPLICATIONS

This is a continuation-in-part application of Application No. 11/580,647 filed on Oct. 13, 2006, the disclosure of which is incorporated herein by reference.

TECHNICAL FIELD

The present invention generally relates to photodiodes and applications of such photodiodes as photodetectors and solar cells.

BACKGROUND

Photodiodes are used in a variety of applications for converting light into electrical signals. For example, photodiodes are employed in photo-detection applications, such as photodetectors for detecting light and solar cells for converting solar radiation into electrical energy. FIG. 1 shows one currently available design for a photodiode 10. The photodiode 10 includes a p-region 12 made from a p-type semiconductor material and an n-region 14 made from an n-type semiconductor material that, together, form a p-n junction 16. A depletion region 18 is formed in the p-region 12 and the n-region 14 by majority-carrier holes in the p-region 12 diffusing into the n-region 14 and majority-carrier electrons in the n-region 14 diffusing into the p-region 12. The diffusion of majority carriers proceeds until an equilibrium junction potential is formed across the depletion region 18 that prevents further diffusion of the majority carriers across the p-n junction 16 from either the p-region 12 or the n-region 14.

The junction potential of the depletion region 18 provides the p-n junction 16 with the familiar, nonlinear-current-voltage characteristics shown in FIG. 2 as I-V curve 20. Under a forward bias voltage (i.e., positive voltage), the junction potential and the width of the depletion region 18 is reduced. Majority-carrier electrons from the n-region 14 and majority-carrier holes from the p-region 12 have sufficient energy to overcome the junction potential and diffuse across the p-n junction 16 to generate a diffusion current. Under a reverse-bias voltage (i.e., negative voltage within the third quadrant of the graph shown in FIG. 2), the junction potential and the width of the depletion region 18 increases dramatically, preventing diffusion of majority carriers from either the p-region 12 or the n-region 14. However, a supply of minority carriers on each side of the p-n junction 16 is generated by thermal excitation of electron-hole pairs. For example, thermally generated electron-hole pairs generated near or in the depletion region 18 on the p-region 12 side of the p-n junction 16 provide minority-carrier electrons. When the electron-hole pairs are generated within a diffusion length of the depletion region 18, the minority-carrier electrons can diffuse into the depletion region 18 and the junction potential sweeps the minority-carrier electrons across the p-n junction 16. Similarly, thermally generated electron-hole pairs generated near or in the depletion region 18 on the n-region 14 side of the p-n junction 16 provide minority-carrier holes and the junction potential sweeps the minority-carrier holes across the p-n junction 16. The drift of minority carriers generates a drift or generation current that is relatively independent of the applied voltage because the minority carriers are generated by an external source, such as thermal or optical energy.

The photodiode 10 may be used as a photodetector for detecting light incident on the p-n junction 16 by exploiting the voltage independence of the generation current. As shown in FIG. 1, electron-hole pairs are generated by illuminating the p-n junction 16 and surrounding regions with light having an energy $E_{light}$ greater than the energy-band gap $E_{gap}$ of the semiconductor material used for the p-region 14 and the n-region 16. Under a reverse-bias voltage, optically-generated-minority carriers within the depletion region 18 or within a diffusion length of the depletion region 18 are swept across the p-n junction 16 by the junction potential to generate an optical-generation current $g_n$. As shown in FIG. 2, the greater the amount of light incident on the p-n junction 16, the greater the magnitude of the optical-generation current. For example, the magnitude of the optical-generation current $g_2$ is greater than the magnitude of the optical-generation current $g_1$ as a result of a higher intensity of light illuminating the p-n junction 16 and the surrounding regions. Thus, the optical-generation current generated by illuminating the p-n junction 16 with light may be used for measuring illumination levels.

An array of the photodiodes 10 may also be used to form a solar-cell array. In a solar-cell array, each of the photodiodes 10 can be operated in the fourth quadrant of the I-V curves shown in FIG. 2 and connected to a common bus that delivers power to a load.

In order to maximize the photoconductive response of the photodiode 10, it is important that optically-generated carriers have a sufficiently long diffusion length so that the optically-generated carriers do not recombine or become trapped prior to diffusing into the depletion region 18 or while being swept across the p-n junction 16. Control of the carrier diffusion length imposes challenges on designers and manufacturers of photodiodes that can necessitate using high-quality and high-cost semiconductor materials, such as single-crystal semiconductor materials. It is often desirable for the depletion region 18 to be sufficiently wide so that a large fraction of the intensity of light is absorbed within the depletion region 18. While increasing the width of the depletion region 18 can improve the optical efficiency of the photodiode 10, it can also deleteriously decrease the response time of the photodiode 10. Therefore, manufacturers and designers of photodiodes continue to seek improved photodiodes in which cheaper, lower-quality semiconductor materials can be utilized without substantially degrading photodiode performance.

SUMMARY

Various embodiments of the present invention are directed to a photodiode module including a structure configured to selectively couple light to a dielectric-surface mode of a photonic crystal of the photodiode module. In one embodiment of the present invention, a photodiode module includes a semiconductor structure having a p-region and an n-region. The photodiode module further includes a photonic crystal having a surface positioned adjacent to the semiconductor structure. A diffraction grating of the photodiode module may be positioned and configured to selectively couple light incident on the diffraction grating to a dielectric-surface mode associated with the surface of the photonic crystal. In another embodiment of the present invention, a photodiode apparatus includes multiple, stacked photodiode modules, each of which is configured to selectively absorb light at a selected wavelength or range of wavelengths.

BRIEF DESCRIPTION OF THE DRAWINGS

The drawings illustrate various embodiments of the present invention, wherein like reference numerals refer to like or similar elements in different views or embodiments shown in the drawings.

FIG. 3 is a schematic isometric view of a photodiode module including a p-n junction according to one embodiment of the present invention.

FIG. 4A is a schematic cross-sectional view taken along line A-A shown in FIG. 3 showing one embodiment of the present invention for a diffraction grating configuration and further showing an intensity profile of a dielectric-surface mode absorbed within the p-n semiconductor structure of the photodiode module.

FIG. 4B is a cross-sectional view taken along line A-A shown in FIG. 3 showing another embodiment of the present invention for a diffraction grating configuration.

DETAILED DESCRIPTION OF THE VARIOUS EMBODIMENTS

Figure 1:
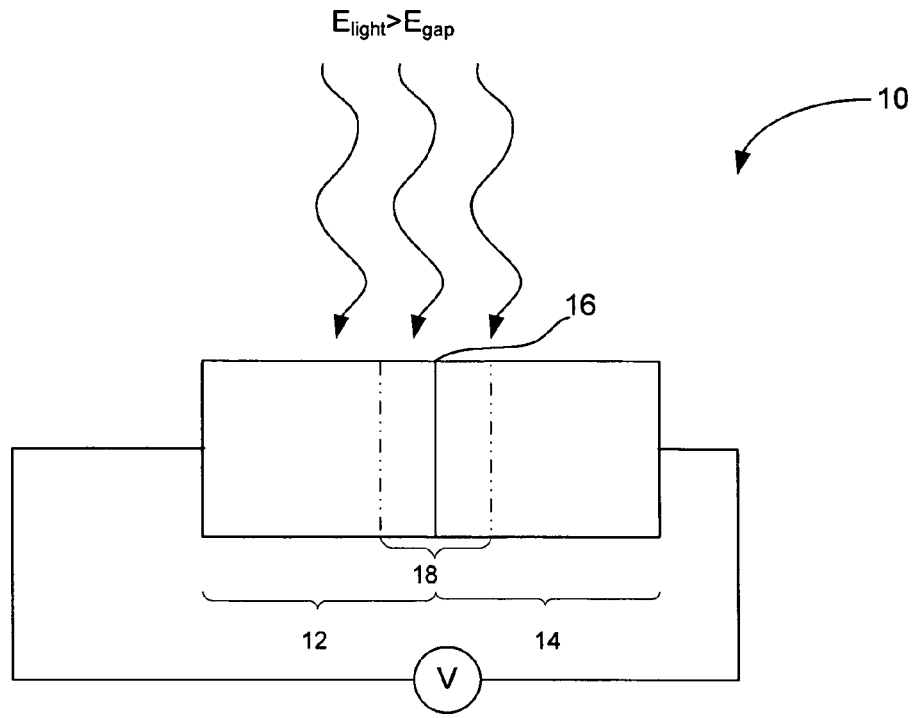
FIG. 1 is a schematic illustration of a currently available photodiode design.

Various embodiments of the present invention are directed to a photodiode module including a structure configured to selectively couple light to a dielectric-surface mode of a photonic crystal of the photodiode module, and a photodiode apparatus that may employ a number of such photodiode modules. The disclosed photodiode modules and apparatuses may be utilized as photodetectors, solar cells, and a number of other applications.

FIG. 3 shows a photodiode module 30 according to one embodiment of the present invention. The photodiode module 30 includes a p-n semiconductor structure 32 having a p-region 34 made from a p-type semiconductor material, an n-region 36 made from an n-type semiconductor material, and a p-n junction 38 formed between the p-region 34 and the n-region 36. The semiconductor materials may be formed from a variety of single crystal, polycrystalline, and amorphous semiconductor materials that are selected for a particular optical application. A depletion region 33 is formed within a portion of the p-region 34 and a portion of the n-region 36 due to majority-carrier holes in the p-region 32 diffusing into the n-region 36 and majority-carrier electrons in the n-region 36 diffusing into the p-region 34. The diffusion of majority carriers proceeds until an equilibrium junction potential is formed across the depletion region 33 that prevents further diffusion of the majority carriers across the p-n junction 38 from either the p-region 34 or the n-region 36.

A number of recesses 42 arranged in a selected periodic pattern may be formed in the p-n semiconductor structure 32 to define a diffraction grating 40. For example, the recesses 42 may be formed with a spacing d in a two-dimensional pattern as shown in the embodiment of FIG. 3, a one-dimensional pattern, or another suitable pattern. As will be discussed in more detail below, the diffraction grating 40 is configured to selectively couple electromagnetic radiation of a selected wavelength or range of wavelengths incident on the diffraction grating 40 to a dielectric-surface mode of a photonic crystal 44 positioned adjacent to the p-n semiconductor structure 32. According to various embodiments of the present invention, the recesses 42 of the diffraction grating 40 may extended within only the p-region 34 as shown in FIG. 4A or the recesses 42 may extended within both the p-region 34 and the n-region 36 as shown in FIG. 4B. In another embodiment of the present invention, a separate dielectric layer having a diffraction grating similarly structured as the diffraction grating 40 may be positioned adjacent to the p-region 34 of the p-n semiconductor structure 32.

Referring again to FIG. 3, the photonic crystal 44 of the photodiode module 30 has an interfacial surface 46 that is positioned adjacent to the n-region 36 of the p-n semiconductor structure 32. In the illustrated embodiment shown in FIG. 3, the photonic crystal 44 is a one-dimensional photonic crystal. Shaded dielectric layers 48 and 49 are comprised of a first dielectric material having a dielectric constant, and un-shaded dielectric layers 50 and 51 are comprised of a second dielectric material having a different dielectric constant. The dielectric layers 48-51 are periodically spaced with a repeat distance a, and the periodic arrangement of the dielectric layers 48-51 results in a photonic-band gap in which one or more range of frequencies/wavelengths of electromagnetic radiation is prevented from propagating in a direction generally perpendicular to the dielectric layers 48-51 of the photonic crystal 44. The dielectric layers 48-49 may have approximately the same dielectric constant as the p-region 34 and the dielectric layers 50-51 may have approximately the same dielectric constant as the n-region 36. As merely an example, the thicknesses of each of the dielectric layers 48-51 may about 100 nm to about 300 nm. As will be discussed in more detail below, the photonic-band gap of the photonic crystal 44 is designed to allow transmission of light of a selected frequency/wavelength range that is not coupled to the dielectric-surface mode of the photonic crystal 44.

It should be noted that the photonic crystal 44 may include more dielectric layers than the four shown in FIG. 3, and the number of dielectric layers shown in FIG. 3 is merely for illustrative purposes. Moreover, the photonic crystal 44 does not need to be a one-dimensional photonic crystal. In other embodiments of the present invention, the photonic crystal 44 may be a two- or three-dimensional photonic crystal exhibiting a photonic-band gap in more than one direction. Accordingly the term "photonic crystal," as used herein includes one-dimensional photonic crystals (e.g., a periodic stack comprising layers of two different dielectrics that alternate periodically in one direction), two-dimensional photonic crystals, and three-dimensional photonic crystals.

Figure 5:
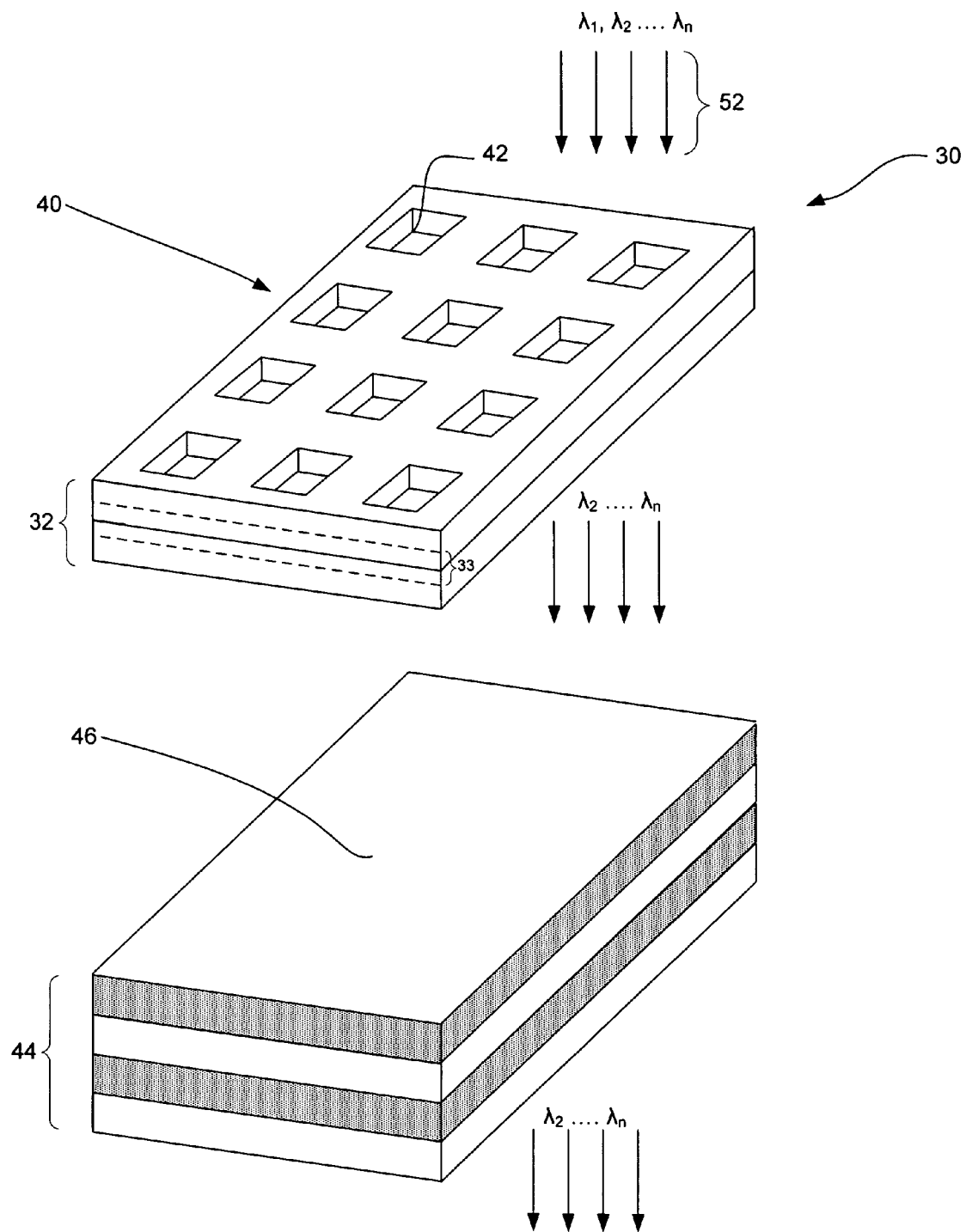
FIG. 5 is a schematic, exploded, isometric view of the photodiode module shown in FIG. 3.

The operation of the photodiode module 30 as a photodetector is best understood with reference to FIG. 5. Free-space light 52 having a range of wavelengths $\lambda_1, \lambda_2 \ldots \lambda_n$ is incident on the diffraction grating 40 of the p-n semiconductor structure 32. The diffraction grating 40 is structured to selectively couple light having a wavelength $\lambda_1$ to a dielectric-surface mode 54 (FIG. 4A) associated with the interfacial surface 46 of the photonic crystal 44. The un-coupled light at the wavelengths $\lambda_2 \ldots \lambda_n$ that are not coupled to the dielectric-surface mode 54 is transmitted through the p-n semiconductor structure 32 because the un-coupled light at the wavelengths $\lambda_2 \ldots \lambda_n$ has an energy less than the energy-band gap of the semiconductor materials used for the p-n semiconductor structure 32. The un-coupled light at wavelengths $\lambda_2 \ldots \lambda_n$ also propagates through the photonic crystal 44 because the light at the wavelengths $\lambda_2 \ldots \lambda_n$ falls outside the forbidden wavelengths of the photonic crystal 44's photonic-band gap.

Turning again to FIG. 4A, as previously described, the diffraction grating 40 couples light of a selected wavelength or range of wavelengths, such as the light at the wavelength $\lambda_1$, to the dielectric-surface mode 54 of the photonic crystal 44. The intensity of the dielectric-surface mode 54 may be about one to about three orders of magnitude greater than the intensity of the incident free-space light at the wavelength $\lambda_1$. Thus, the diffraction grating 40 enhances the intensity of the incident light at the wavelength $\lambda_1$ received by the photodiode module 30. At a surface of a photonic crystal, a dielectric-surface mode exists in which an electromagnetic wave may be generally confined to the surface and regions immediately adjacent to the surface. The resonance condition that permits transfer of energy from the light at the wavelength $\lambda_1$ to the dielectric-surface mode 54 generally requires that both the energy and momentum of the light at the wavelength $\lambda_1$ match the energy and momentum of the dielectric-surface mode 54. Irradiating the diffraction grating 40 with the free-space light 52 causes the light at the wavelength $\lambda_1$ to diffract and the diffracted light having a wavevector equal to and aligned with the wavevector of the dielectric-surface mode 54 (i.e., in a direction generally parallel to the x-axis direction) is coupled to the dielectric-surface mode 54 of the photonic crystal 44.

FIG. 4A shows the intensity distribution of the dielectric-surface mode 54 propagating along the interfacial surface 46 generally in an x-axis direction. The intensity decays exponentially in a direction toward the p-n semiconductor structure 32 and also decays exponentially in a direction into the bulk of the photonic crystal 44. A large fraction of the intensity of the dielectric-surface mode 54 is absorbed by the p-n semiconductor structure 32. Depending upon the number of dielectric layers that comprises the photonic crystal 44, the maximum intensity of the dielectric-surface mode 54 may be positioned within the depletion region 33 of the p-n semiconductor structure 32 by proper design of the photonic crystal 44 to increase the number of electron-hole pairs generated within the depletion region 33. Electron-hole pairs are generated in the p-n semiconductor structure 32 responsive to absorption of the dielectric-surface mode 54 in the p-n semiconductor structure 32. When the p-n junction 38 of the p-n semiconductor structure 32 is reverse biased using a voltage source 45, a current is generated across the p-n junction 38 that is generally independent of the applied voltage and proportional to the amount of light at the wavelength $\lambda_1$ coupled to the dielectric-surface mode 54.

Figure 2:
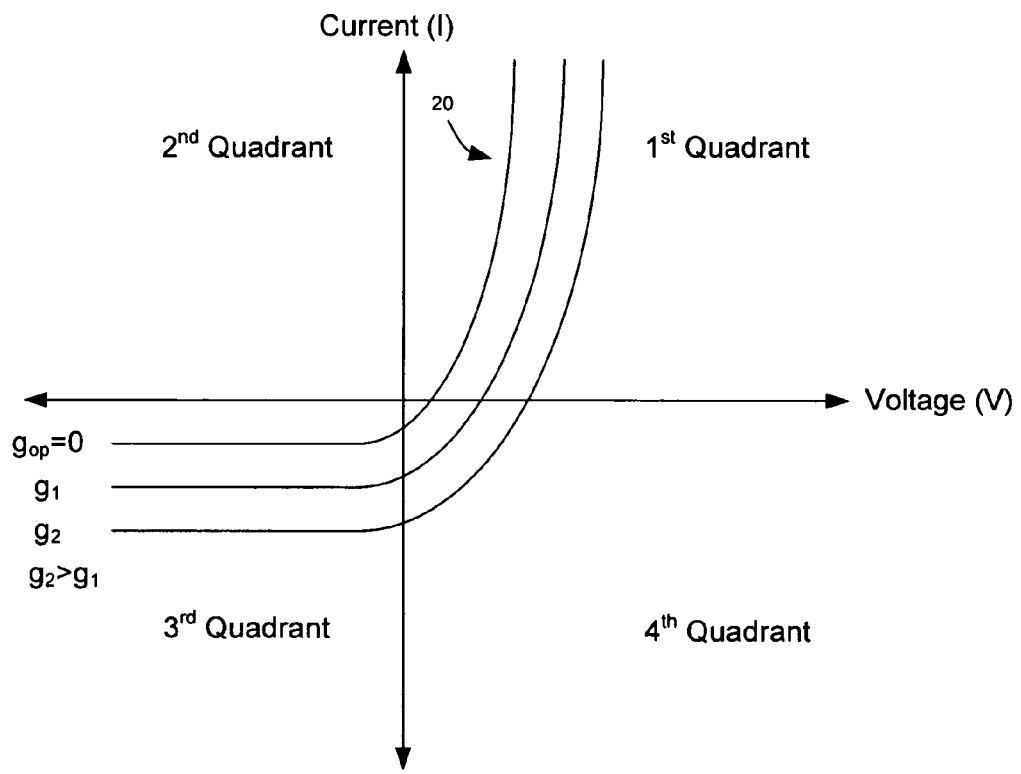
FIG. 2 is a graph depicting the current-voltage characteristics of the photodiode shown in FIG. 1 with and without optical stimulation.

In a mode of operation according to another embodiment of the present invention suitable for utilizing the photodiode module 30 as one of many solar cells in a solar-cell array, the photodiode module 30 may be forward biased to the fourth quadrant of the I-V curve (FIG. 2) where the voltage is positive and the current generated is negative. In such an embodiment of the present invention, the diffraction grating 40 may be configured to couple light having a wavelength between about 575 nm to about 585 nm, which is about the peak wavelength of the solar spectrum (i.e., yellow), to the dielectric-surface mode 46 of the photonic crystal 44.

Due to the high-intensity of the dielectric-surface mode 54, the p-n semiconductor structure 32 may be fabricated with a thickness of about 10 nm to about 30 nm, while still absorbing the same or greater amount of light and generating the same or greater number of electron-hole pairs than that of a p-n semiconductor structure made from the same or similar material with a thickness of, for example 1 μm. As such, the p-n semiconductor structure 32 may be fabricated from relatively low-quality semiconductor materials, such as polycrystalline silicon, amorphous silicon, or single-crystal semiconductor materials that may have a significant amount of crystalline or other defects. Because the p-n semiconductor structure 32, depletion region 33, or both may have a thickness that is less than the diffusion length of electrons and holes generated by the intense dielectric-surface mode 54, the electron and holes do not recombine or become trapped by defect sites within the p-n semiconductor structure 32 prior to being swept across the p-n junction 38. Moreover, due to the depletion region 33 of the p-n semiconductor structure 32 being relatively thin (e.g., a thickness of about 10 nm to about 30 nm), the response time of the photodiode module 30 may be increased because the minority carriers generated by absorption of the dielectric-surface mode 54 do not have to travel a substantial distance to reach the depletion region 33 prior to being swept across the p-n junction 38. Therefore, the detection capability of the photodiode module 30 may not be degraded while allowing for cheaper and easier fabrication of the p-n semiconductor structure 32 with less pure, higher defect semiconductor materials.

As can be appreciated from FIGS. 3 through 5, the photodiode module 30 may be used for detecting light of a selected wavelength (e.g., $\lambda_1$ in FIG. 5), while also allowing other, un-detected, wavelengths of light (e.g., $\lambda_2$ in FIG. 5) to be transmitted through the photodiode module 30 substantially un-attenuated. Accordingly, the photodiode module 30 may be used in optical-fiber-communication applications that require selectively detecting certain wavelengths of light propagating in an optical fiber, while allow signals having other wavelengths not absorbed by the photodiode module 30 to be transmitted through the photodiode module 30 for further processing or use.

Figure 6:
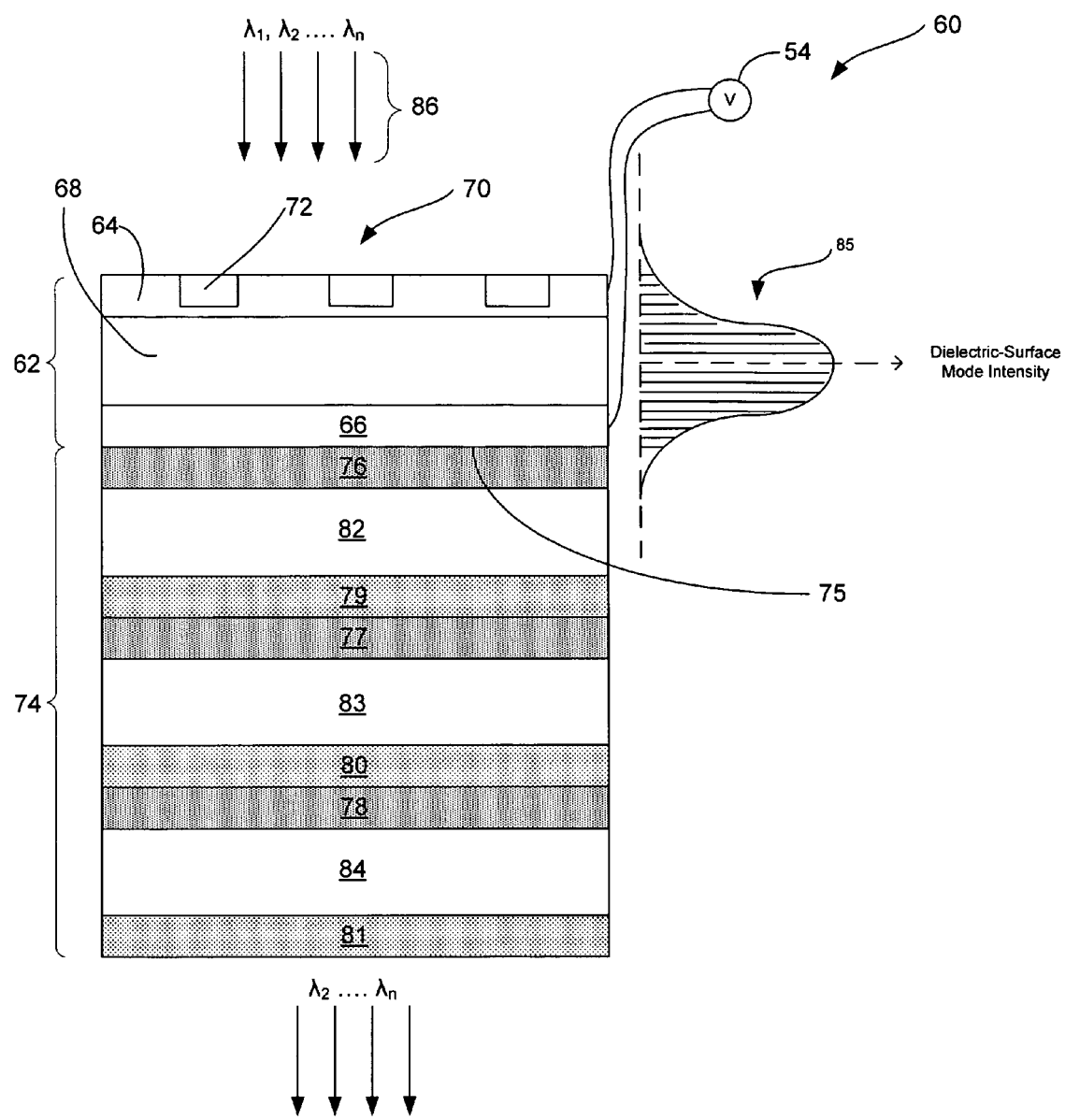
FIG. 6 is a schematic cross-sectional view of a photodiode module including a p-i-n semiconductor structure according to another embodiment of the present invention.

In other embodiments of the present invention, a p-i-n semiconductor structure may be used instead of a p-n junction. FIG. 6 shows a photodiode module 60 according to another embodiment of the present invention. The photodiode module 60 includes a p-i-n semiconductor structure 62 having a p-region 64, an n-region 66, and an intrinsic region 68 located between the p-region 64 and the n-region 66. The intrinsic region 68 may be made from an intrinsic semiconductor material or a semiconductor material having a resistance that is substantially greater than that of the p-region 64 and the n-region 66. A depletion region is formed across the intrinsic region 68 and, unlike the depletion region 38 of the p-n semiconductor structure 32 shown in FIG. 3, the width of the depletion region is relatively independent of an applied voltage. As with the photodiode module 30, a diffraction grating 70 including a number of recesses 72 arranged in a selected periodic pattern may be formed in the p-region 64, as shown in FIG. 6, or the recesses 72 may extend into the intrinsic region 68 and/or the n-region 66. The photodiode module 60 further includes a photonic crystal 74 having an interfacial surface 75 capable of supporting a dielectric-surface mode 85, which may be a one-dimensional photonic crystal. The photonic crystal 74 may be comprised of a periodic arrangement of dielectric layers 76-84 that generally reproduces the dielectric-constant profile of the p-i-n semiconductor structure 62. The dielectric layers 76-78 may have a dielectric constant that is approximately the same as the dielectric constant of the p-region 64, the dielectric layers 79-81 may have a dielectric constant that is approximately the same as the dielectric constant of the n-region 66, and the dielectric layers 82-84 may have a dielectric constant that is approximately the same as the dielectric constant of the intrinsic region 68.

The photodiode module 60 functions similarly to the photodiode module 30 shown in FIG. 3. Free-space light 86 having a range of wavelengths $\lambda_1, \lambda_2 \ldots \lambda_n$ is incident on the diffraction grating 70. The light at the wavelength $\lambda_1$ is selectively coupled to the dielectric-surface mode 85 of the interfacial surface 75 of the photonic crystal 74. As shown in FIG. 6, the photonic crystal 74 may be 30 designed so that maximum intensity of the dielectric-surface mode 85 is positioned within the intrinsic region 68 of the p-i-n semiconductor structure 62. As a result of the intense dielectric-surface mode 85 extending within the p-i-n semiconductor structure 62, electron-hole pairs are generated within the p-i-n semiconductor structure 62 and, consequently, a current proportional to the amount of light at the wavelength $\lambda_1$. The light having the wavelengths $\lambda_2 \ldots \lambda_n$ that is not coupled to the dielectric-surface mode 85 is transmitted through the semiconductor structure 62 and the photonic crystal 74.

Figure 7:
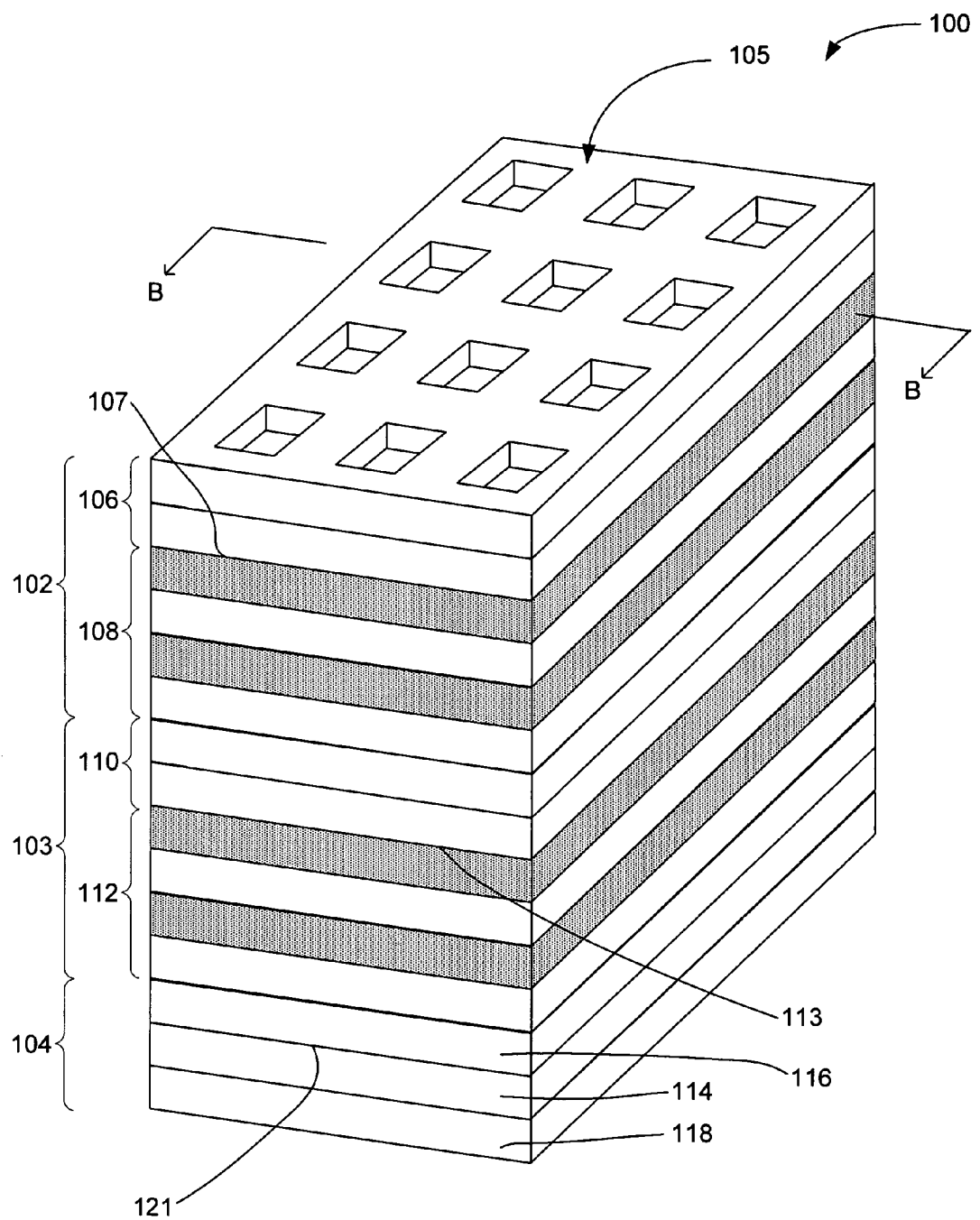
FIG. 7 is an isometric view of a photodiode apparatus including multiple photodiode modules according to yet another embodiment of the present invention.
Figure 8:
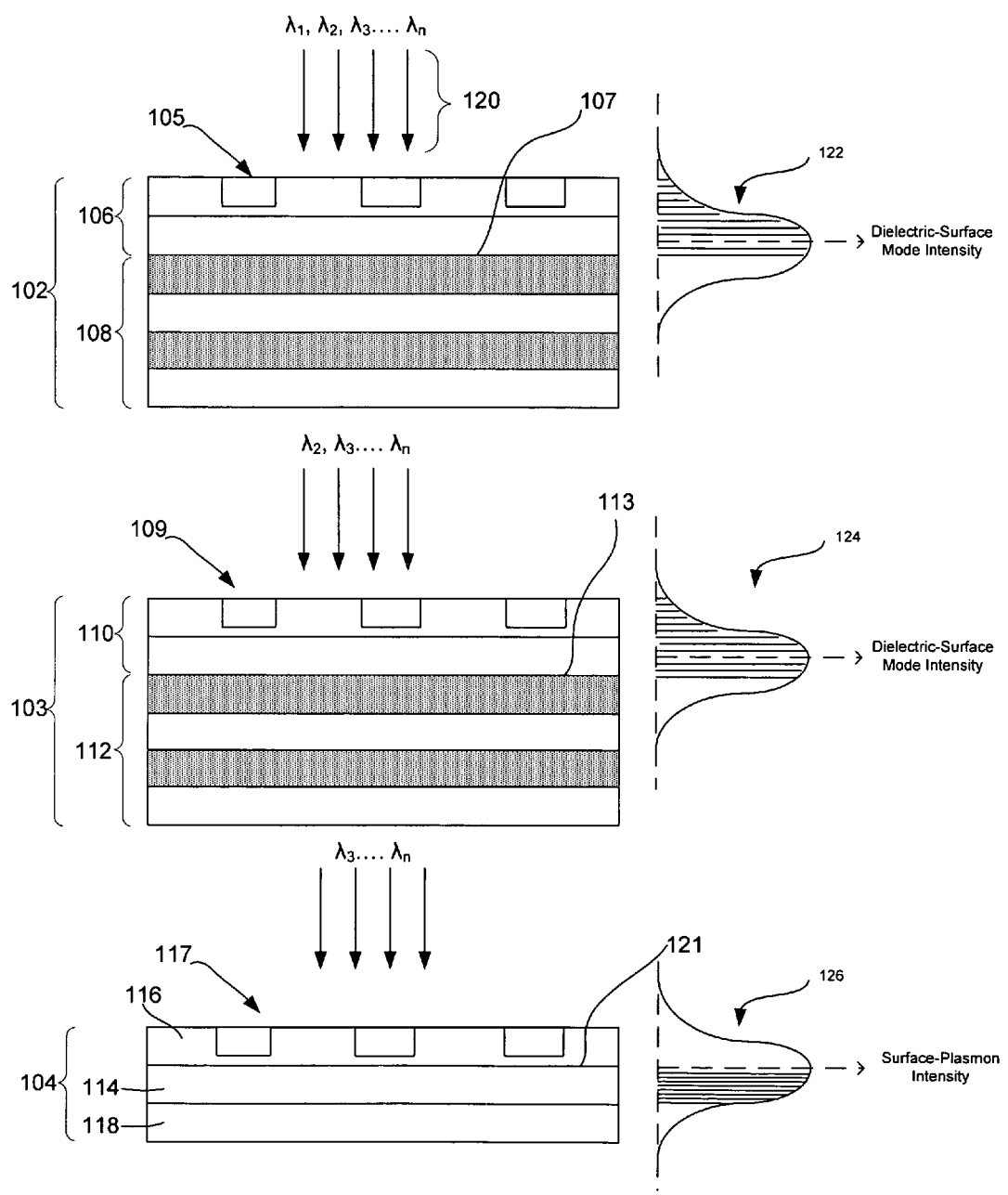
FIG. 8 is a schematic, exploded, cross-sectional view of the photodiode apparatus shown in FIG. 7 showing an intensity profile of individual dielectric-surface modes absorbed by individual p-n junctions of first and second photodiode modules and an intensity profile of a surface-plasmon mode absorbed within a semiconductor material of a third photodiode module.

FIGS. 7 and 8 show a photodiode apparatus 100 including a number of stacked photodiode modules 102-104, each of which is configured to be selectively absorb a different wavelength or range of wavelengths of light. Each of the photodiode modules 102 and 103 may be configured as the photodiode modules 30 or 60 shown in FIGS. 3 and 6, respectively. The photodiode module 102 includes a p-n semiconductor structure 106 with a diffraction grating 105 and a photonic crystal 108 with an interfacial surface 107 positioned adjacent to the p-n semiconductor structure 106. The diffraction grating 105 is configured to selectively couple light having a wavelength $\lambda_1$ to a dielectric-surface mode supported at the interfacial surface 107. The photodiode module 103 includes a p-n semiconductor structure 110 with a diffraction grating 109 and a photonic crystal 112 with an interfacial surface 113 positioned adjacent to the p-n semiconductor structure 110. The diffraction grating 109 is configured to selectively couple light having a wavelength $\lambda_2$ to a dielectric-surface mode supported at an interfacial surface 113. Although the photodiode modules 102 and 103 are illustrated using p-n semiconductor structures with respective p-n junctions, the photodiode modules 102 and 103 may utilize p-i-n semiconductor structures as previously described with respect to the photodiode module 60 shown in FIG. 6.

The photodiode module 104 of photodiode apparatus 100 may be configured as a metal-semiconductor-metal ("M-S-M") photodiode. A MSM photodiode may be utilized to reduce the size of the photodiode module 104 relative to the size of the photodiode modules 102 and 103. However, in other embodiments of the present invention, a photodiode module similar to the photodiode modules 30 and 60 shown in FIGS. 3 and 6, respectively, may be used to selectively allow certain wavelengths of light to be transmitted through the photodiode apparatus 100. The photodiode module 104 includes a metallic electrode 116 including a diffraction grating 117 similar to the diffraction gratings previously discussed above, an electrode 118, and a semiconductor material 114 positioned between the electrodes 116 and 118 and in electrical contact with electrodes 116 and 118. The metallic electrode 116 may comprise gold, silver, platinum, copper, aluminum, chromium, alloys of any of the preceding metals, or another suitable material. The diffraction grating 117 is configured to selectively couple light at a wavelength $\lambda_3$ to a surface-plasmon mode supported by the metallic electrode 116.

As shown in FIG. 8, in operation, free-space light 120 including a range of wavelengths $\lambda_1, \lambda_2, \lambda_3 \ldots \lambda_n$ is incident on the diffraction grating 105 of the photodiode module 102. The diffraction grating 105 couples light at the wavelength $\lambda_1$ to a dielectric-surface mode 122 that propagates along the interfacial surface 107 and enhances the intensity of the light at the wavelength $\lambda_1$. The light at the wavelengths $\lambda_2$ and $\lambda_3$ is transmitted through the p-n semiconductor structure 106 and the photonic crystal 108 because the light at wavelengths $\lambda_2$ and $\lambda_3$ falls within the energy-band gap of the p-n semiconductor structure 106 and does not fall within the forbidden range of wavelengths of the photonic-band gap of the photonic crystal 108. The light at the wavelengths $\lambda_2$ and $\lambda_3$ is transmitted through the photodiode module 102 and is incident on the diffraction grating 109 of the photodiode module 103. The diffraction grating 109 selectively couples light at the wavelength $\lambda_2$ to a dielectric-surface mode 124 that propagates along the interfacial surface 113 of the photonic crystal 112. The coupling of the light at the wavelength $\lambda_2$ to the dielectric-surface mode 124 enhances the intensity of the light at the wavelength $\lambda_2$. The light at the wavelength $\lambda_3$ is transmitted through the p-n semiconductor structure 110 and the photonic crystal 112 because the light at the wavelength $\lambda_3$ falls within the energy-band gap of the p-n semiconductor structure 110 and does not fall within the forbidden range of wavelengths of the photonic-band gap of the photonic crystal 112. The light at the wavelength $\lambda_3$ is transmitted through the photodiode module 103 and is incident on the diffraction grating 117 of the photodiode module 104. The diffraction grating 117 selectively couples light at the wavelength $\lambda_3$ to a surface-plasmon mode 126 that propagates along the interfacial surface 121 between the semiconductor material 114 and the metallic electrode 116. A surface-plasmon mode is an electromagnetic field generally confined to an interface between a metallic material having a negative dielectric constant and another medium having a positive dielectric constant. The surface-plasmon mode is a result of the collective oscillations of the free-electron gas of the metallic material. The coupling of the light at the wavelength $\lambda_3$ to the surface-plasmon mode 126 enhances the intensity of the light at the wavelength $\lambda_3$.

In a mode of operation according to an embodiment of the present invention, the photodiode modules 102-104 may be employed as photodetectors. In such a mode of operation, each of the photodiode modules 102-104 may be individually reversed biased, and the photo-current generated in each of the photodiode modules 102-104 responsive to the absorption of the light at the wavelengths $\lambda_1, \lambda_2$, and $\lambda_3$, respectively, may be used for determining the amount of light absorbed by the photodiode modules 102, 103, and 104 at the wavelengths $\lambda_1, \lambda_2$, and $\lambda_3$, respectively in a manner similar to the photodiode module 30 shown and described with respect to FIG. 3.

Figure 9:
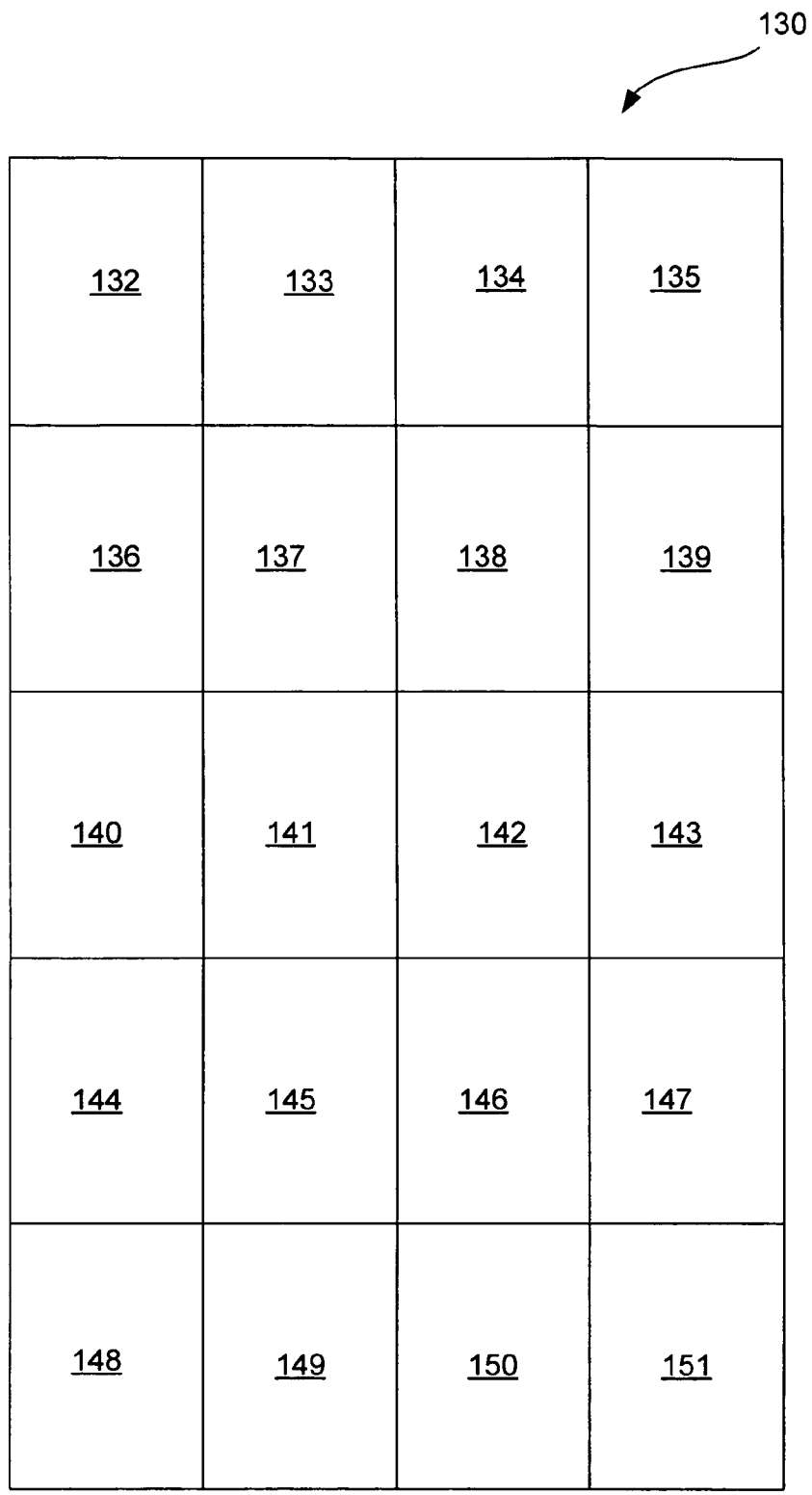
FIG. 9 is a plan view of an array of photodiode modules/apparatuses according to yet another embodiment of the present invention.

In another embodiment of the present invention suitable for utilizing the photodiode apparatus 100 as the individual solar cells of a solar-cell array, the photodiode apparatus 100 may be forward biased to the fourth quadrant of the I-V curve (FIG. 2) where the voltage is positive and the current generated is negative. When the photodiode apparatus 100 is used as a solar cell, the multiple photodiode modules 102-104 enables increasing the quantum efficiency of the photodiode apparatus 100 because each of the photodiode modules 102-104 may be optimized to absorb solar radiation at one of the peak wavelengths of the solar spectrum. For example, FIG. 9 shows yet another embodiment of the present invention in which any of the preceding embodiments of photodiodes modules and photodiode apparatuses may be arranged as an array 130 including a number of photodiode modules or apparatuses 132-151. Each of the photodiode modules or apparatuses 132-151 may be connected to a common bus (not shown) and the solar generated electrical current generated by each of the photodiode modules or apparatuses 132-151 may be delivered the common bus and further to a load.

Although the present invention has been described in terms of particular embodiments, it is not intended that the present invention be limited to these embodiments. Modifications within the spirit of the present invention will be apparent to those skilled in the art. For example, in another embodiment of the present invention, one or more dielectric layers may be interposed between the p-n or p-i-n semiconductor structure and the photonic crystal. The diffraction grating configuration may also depart from the diffraction grating configuration shown in FIGS. 3 through 7. For example, the recesses may have other geometries than the rectangular-shaped recesses shown in FIGS. 3 through 7 such as, circular or another suitable geometry. Furthermore, other periodic patterns may be used for the diffraction grating that the illustrated diffraction gratings.

The foregoing description, for purposes of explanation, used specific nomenclature to provide a thorough understanding of the present invention. However, it will be apparent to one skilled in the art that the specific details are not required in order to practice the present invention. The foregoing descriptions of specific embodiments of the present invention are presented for purposes of illustration and description. They are not intended to be exhaustive of or to limit the present invention to the precise forms disclosed. Obviously, many modifications and variations are possible in view of the above teachings. The embodiments are shown and described in order to best explain the principles of the present invention and its practical applications, to thereby enable others skilled in the art to best utilize the present invention and various embodiments with various modifications as are suited to the particular use contemplated. It is intended that the scope of the present invention be defined by the claims and their equivalents.

The invention claimed is:

1. A photodiode module, comprising:
a semiconductor structure including a p-region and an n-region;
a photonic crystal including a surface positioned adjacent to the semiconductor structure; and
a diffraction grating positioned and configured to selectively couple light incident on the diffraction grating to a dielectric-surface mode associated with the surface of the photonic crystal, wherein the photonic crystal is configured to confine the dielectric-surface mode to the surface and regions adjacent to the surface.

2. The photodiode module of claim 1 wherein the diffraction grating is integrally formed from a portion of the semiconductor structure.

3. The photodiode module of claim 1 wherein the diffraction grating is a separate dielectric layer positioned adjacent to the semiconductor structure.

4. The photodiode module of claim 1 wherein the photonic crystal comprises a one-dimensional photonic crystal.

5. The photodiode module of claim 1 wherein the diffraction grating is configured to couple a portion of the light having a selected wavelength to the dielectric-surface mode, and further wherein the photonic crystal is configured to transmit a portion of the light that is not coupled to the dielectric-surface mode passing through the semiconductor structure.

6. The photodiode module of claim 1 wherein the semiconductor structure comprises a depletion region located between the p-region and the n-region.

7. The photodiode module of claim 1 wherein the photonic crystal is configured so that a maximum intensity of the dielectric-surface mode is located in a depletion region of the semiconductor structure.

8. An array of photodiode modules including a number of photodiode modules each of which is configured as the photodiode module of claim 1.

9. A photodiode apparatus, comprising:
a first photodiode module including:
a first semiconductor structure including a p-region and an n-region;
a first photonic crystal including a first surface positioned adjacent to the first semiconductor structure; and
a first diffraction grating positioned and configured to selectively couple a portion of light incident on the first diffraction grating to a first dielectric-surface mode associated with the first surface of the first photonic crystal; and
a second photodiode module positioned to receive a first transmitted light transmitted through the first semiconductor structure and the first photonic crystal of the first photodiode module, the second photodiode including:
a second semiconductor structure including a p-region and an n-region;
a second photonic crystal including a second surface positioned adjacent to the second semiconductor structure; and
a second diffraction grating positioned and configured to selectively couple at least a portion of the first transmitted light incident on the second diffraction grating to a second dielectric-surface mode associated with the second surface of the second photonic crystal.

10. The photodiode apparatus of claim 9 wherein the second diffraction grating is configured to couple a portion of the first transmitted light having a selected wavelength to the second dielectric-surface mode, and further wherein the second photonic crystal is configured to transmit a portion of the first transmitted light that is not coupled to the second dielectric-surface mode of the second photodiode module.

11. The photodiode apparatus of claim 9, further comprising a third photodiode module positioned to receive a second transmitted light transmitted through the second semiconductor structure and the second photonic crystal of the second photodiode module, the third photodiode module comprising:
a first metallic conductive electrode, the first metallic conductive electrode comprising a third diffraction grating, the third diffraction grating configured to selectively couple at least a portion of the second transmitted light received from the second photodiode module to a surface-plasmon mode associated with the first metallic conductive electrode;
a second conductive electrode; and
a semiconductor material positioned between and electrically coupled with the first metallic conductive electrode and the second conductive electrode.

12. The photodiode apparatus of claim 9 wherein the first diffraction grating is integrally formed from a portion of the first semiconductor structure, and further wherein the second diffraction gating is integrally formed from a portion of the second semiconductor structure.

13. The photodiode apparatus of claim 9 wherein the first photonic crystal is configured so that a maximum intensity of the first dielectric-surface mode is located in a depletion region of the first semiconductor structure, and further wherein the second photonic crystal is configured so that a maximum intensity of the second dielectric-surface mode is located in a depletion region of the second semiconductor structure.

14. The photodiode apparatus of claim 9 wherein each of the first and second photonic crystals comprises a one-dimensional photonic crystal.

* * * * *

UNITED STATES PATENT AND TRADEMARK OFFICE
CERTIFICATE OF CORRECTION

| | | |
|---|---|---|
| PATENT NO. | : 7,964,925 B2 | Page 1 of 1 |
| APPLICATION NO. | : 11/654046 | |
| DATED | : June 21, 2011 | |
| INVENTOR(S) | : David Fattal et al. | |

It is certified that error appears in the above-identified patent and that said Letters Patent is hereby corrected as shown below:

In column 9, line 63, in Claim 8, delete "photodiodc" and insert -- photodiode --, therefor.

In column 10, line 36, in Claim 11, delete "photodiodc" and insert -- photodiode --, therefor.

In column 10, line 49, in Claim 12, delete "photodiodc" and insert -- photodiode --, therefor.

In column 10, line 52, in Claim 12, delete "gating" and insert -- grating --, therefor.

In column 10, line 61, in Claim 14, delete "photodiodc" and insert -- photodiode --, therefor.

Signed and Sealed this
Twentieth Day of March, 2012

David J. Kappos
*Director of the United States Patent and Trademark Office*